(12) United States Patent
Fujita

(10) Patent No.: US 9,882,011 B2
(45) Date of Patent: Jan. 30, 2018

(54) SEMICONDUCTOR DEVICE WITH REDUCED PARASITIC DRAIN-GATE CAPACITANCE AND METHOD OF MANUFACTURING THE SAME

(71) Applicant: Mitsubishi Electric Corporation, Tokyo (JP)

(72) Inventor: Koichi Fujita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/286,749

(22) Filed: Oct. 6, 2016

(65) Prior Publication Data
US 2017/0229552 A1    Aug. 10, 2017

(30) Foreign Application Priority Data

Feb. 4, 2016    (JP) .................................. 2016-019685

(51) Int. Cl.
| | | |
|---|---|---|
| H01L 27/148 | (2006.01) | |
| H01L 29/417 | (2006.01) | |
| H01L 21/283 | (2006.01) | |
| H01L 21/768 | (2006.01) | |
| H01L 23/552 | (2006.01) | |

(Continued)

(52) U.S. Cl.
CPC ........ *H01L 29/4175* (2013.01); *H01L 21/283* (2013.01); *H01L 21/76895* (2013.01); *H01L 23/552* (2013.01); *H01L 24/03* (2013.01); *H01L 24/06* (2013.01); *H01L 24/14* (2013.01); *H01L 29/0847* (2013.01); *H01L 29/42356* (2013.01); *H01L 29/66568* (2013.01); *H01L 29/78* (2013.01); *H01L 2224/0401* (2013.01);
(Continued)

(58) Field of Classification Search
CPC ......... H01L 29/4175; H01L 2924/1309; H01L 21/76895; H01L 21/283; H01L 24/14; H01L 24/06; H01L 29/778; H01L 29/78; H01L 23/552; H01L 24/03; H01L 29/0847
USPC ........ 257/151, 153, 175, 250, 346, 387, 401
See application file for complete search history.

(56) References Cited

U.S. PATENT DOCUMENTS

| | | |
|---|---|---|
| 7,420,247 B2 | 9/2008 | Xu et al. |
| 2003/0160324 A1 | 8/2003 | Dragon et al. |

(Continued)

FOREIGN PATENT DOCUMENTS

| | | |
|---|---|---|
| JP | 2004-006816 A | 1/2004 |
| JP | 2005-519474 A | 6/2005 |

*Primary Examiner* — Tan N Tran
(74) *Attorney, Agent, or Firm* — Studebaker & Brackett PC

(57) ABSTRACT

A semiconductor device having electrodes of three or more levels, includes: a semiconductor substrate; an epitaxial layer formed on the semiconductor substrate; a transistor formed on the epitaxial layer; a source electrode formed on the epitaxial layer and electrically connected to a source of the transistor; and a gate drawing electrode formed on the epitaxial layer and electrically connected to a gate of the transistor, wherein the source electrode includes a first source electrode, a second source electrode which is an electrode at a second or higher level on the first source electrode, and a third source electrode which is an electrode at a third or higher level on the second source electrode and above the gate drawing electrode, and the gate drawing electrode is an electrode at a second or higher level on the first source electrode and surrounded with the first, second, and third source electrodes.

21 Claims, 17 Drawing Sheets

(51) Int. Cl.
*H01L 23/00* (2006.01)
*H01L 29/08* (2006.01)
*H01L 29/423* (2006.01)
*H01L 29/66* (2006.01)
*H01L 29/78* (2006.01)

(52) U.S. Cl.
CPC ............ *H01L 2224/05025* (2013.01); *H01L 2924/13091* (2013.01); *H01L 2924/3025* (2013.01)

(56) References Cited

U.S. PATENT DOCUMENTS

| | | | |
|---|---|---|---|
| 2004/0021156 A1 | 2/2004 | Asano et al. | |
| 2006/0175658 A1* | 8/2006 | Lee | H01L 29/7835 257/341 |
| 2011/0230041 A1* | 9/2011 | Chakihara | H01L 21/823885 438/587 |
| 2015/0061782 A1* | 3/2015 | Li | H01L 27/088 331/57 |

* cited by examiner

SEMICONDUCTOR DEVICE WITH REDUCED PARASITIC DRAIN-GATE CAPACITANCE AND METHOD OF MANUFACTURING THE SAME

BACKGROUND OF THE INVENTION

Field

The present invention relates to a semiconductor device and a method of manufacturing the same.

Background

Parasitic components such as a gate resistance, a gate capacitance, and a source resistance must be reduced to improve the characteristic of a semiconductor device, especially, a horizontal field effect transistor which operates with a high output ranging from several watts to several hundred watts in a high-frequency band from a frequency of 3 MHz to a frequency of 3 GHz. For this purpose, a gate drawing electrode and a source trench have been proposed. A hollow package made of an expensive metal and ceramic has been used for a horizontal field effect transistor to secure a high heat dissipation capacity. Furthermore, application of a low-price plastic mold package or a low-price flip-chip package has been promoted to reduce the size and cost of a product. However, a parasitic capacitance of the gate electrode or the drain electrode disadvantageously increases to deteriorate the high-frequency characteristic of the product.

As a method for reducing a parasitic capacitance of a gate electrode, it is proposed that a gate drawing electrode is shielded with a shield electrode grounded on a source to reduce the capacitances of a drain electrode and a gate electrode (for example, see Published Japanese Translation No. 2005-519474 of the PCT International Publication).

It is proposed that a space surrounded by a grounded shield metal, a gate electrode, a drain electrode, and a source electrode is made hollow to reduce a parasitic capacitance in application of a mold package so as to reduce parasitic capacitances between the electrodes (for example, see Japanese laid-open publication No. 2004-6816). As a method for reducing a source resistance, a structure that directly electrically connects a source electrode to a low-resistance sub-layer by using a high-resistance silicon epitaxial layer in a source region as a source trench has been also proposed (for example, see U.S. Pat. No. 7,420,247).

When a conventional semiconductor device has been further reduced in size, distances between a gate electrode, a drain electrode, and a source electrode decrease to increase parasitic capacitances between the electrodes so as to make it difficult to achieve a high gain. For this reason, the parasitic capacitances between the electrodes must be further reduced. Since the reduction in size allows heat dissipation capacity to decrease, improvement in heat dissipation capacity is disadvantageously necessary.

In Published Japanese Translation No. 2005-519474 of the PCT International Publication, a gate drawing electrode is disposed between source electrodes at a first level to reduce a gate resistance so as to improve a high-frequency operation. Furthermore, a shield electrode grounded to a source at a second level shields a gate electrode from a drain electrode to reduce the capacitance of the gate electrode and to prevent the capacitance from being increased in application of a plastic mold package. However, the area of a source region of the semiconductor device increases because the source electrode and a gate drawing wire are formed at the first level, thus the semiconductor device is difficult to be reduced in size. Since a silicon oxide film ($SiO_2$) or the like that is a dielectric material is present between the gate electrode and the source shield electrode, a capacitance between the source and the gate disadvantageously increases to make it difficult to perform a high-frequency operation.

In Japanese laid-open publication No. 2004-6816, the presence of a glass coat film formed of a dielectric film between a gate electrode and a drain electrode allows a parasitic capacitance between a gate and a drain to be generated. For this reason, a further high-frequency operation is disadvantageously difficult to be performed. In U.S. Pat. No. 7,420,247, burying of a source trench opening having a high step, an increase in area of a source region, and the like are disadvantageously caused.

SUMMARY

The present invention has been made to solve the above problems and has as its object to obtain a semiconductor device that can prevent a high-frequency power gain from decreasing and can be reduced in size and a method of manufacturing the same.

According to the present invention, a semiconductor device having electrodes of three or more levels, includes: a semiconductor substrate; an epitaxial layer formed on the semiconductor substrate; a transistor formed on the epitaxial layer; a source electrode formed on the epitaxial layer and electrically connected to a source of the transistor; and a gate drawing electrode formed on the epitaxial layer and electrically connected to a gate of the transistor, wherein the source electrode includes a first source electrode, a second source electrode which is an electrode at a second or higher level on the first source electrode, and a third source electrode which is an electrode at a third or higher level on the second source electrode and above the gate drawing electrode, and the gate drawing electrode is an electrode at a second or higher level on the first source electrode and surrounded with the first, second, and third source electrodes.

In the present invention, since the gate drawing electrode is surrounded by the first, second, and third source electrodes which are grounded, output power flowing in the drain electrode is not fed back to the gate drawing electrode, and a high-frequency power gain can be prevented from decreasing. Since the gate drawing electrode at second or higher level is surrounded by the second electrode at second or higher level and the third source electrode at third or higher level, a horizontal dimension is reduced to make it possible to reduce the device in size. Even though a plastic mold package or a chip size package is applied, a high-frequency power gain can be prevented from decreasing.

Other and further objects, features and advantages of the invention will appear more fully from the following description.

DESCRIPTION OF EMBODIMENTS

A semiconductor device and a method of manufacturing the same according to the embodiments of the present invention will be described with reference to the drawings. The same components will be denoted by the same symbols, and the repeated description thereof may be omitted.

Embodiment 1

Figure 1:
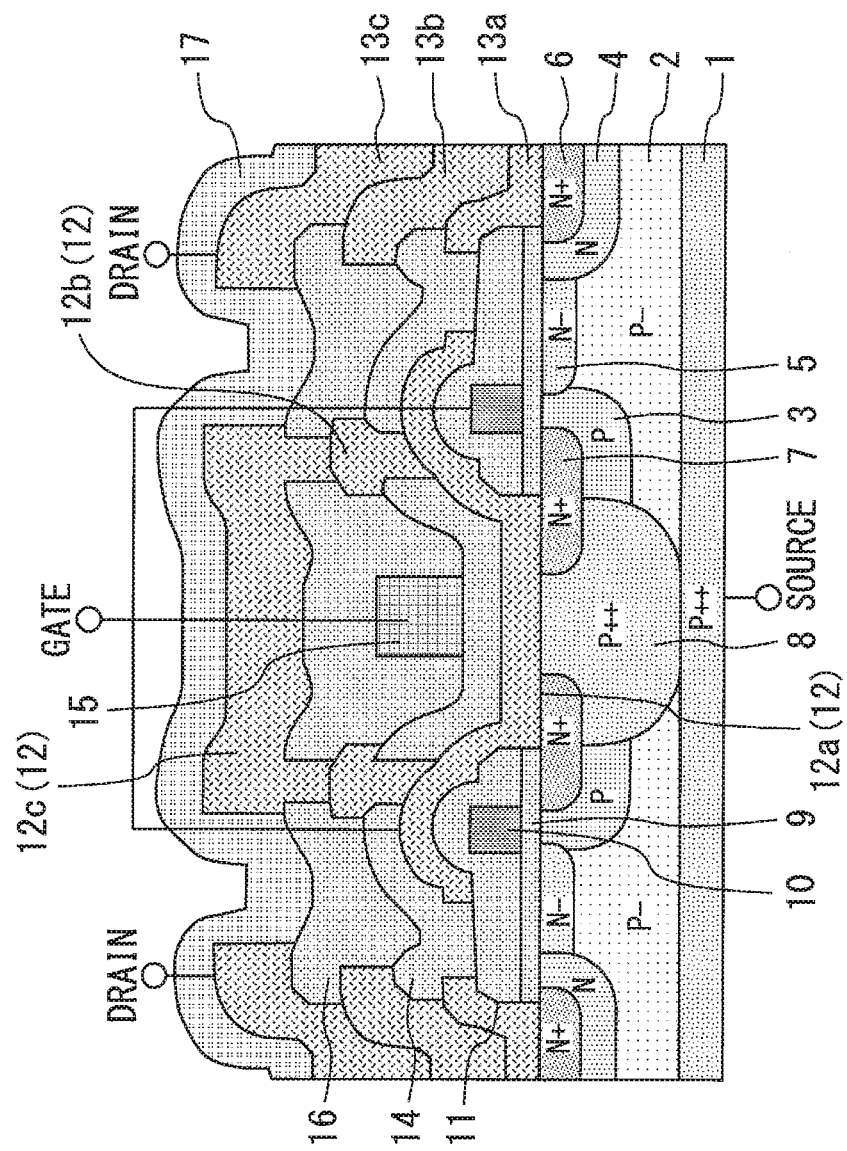
FIG. 1 is a sectional view showing a semiconductor device according to Embodiment 1 of the present invention.

FIG. 1 is a sectional view showing a semiconductor device according to Embodiment 1 of the present invention. The semiconductor device is a high-frequency high-output horizontal field effect transistor (LDMOSFET) having electrodes of three or more levels.

A P$^-$-type epitaxial layer 2 is formed on a P$^{++}$-type semiconductor substrate 1. On the P-type epitaxial layer 2, a P-type channel layer 3, an N-type drain layer 4, an N$^-$-type drain layer 5, an N$^+$-type drain layer 6, an N$^+$-type source layer 7, and a P$^{++}$-type source sinker layer 8 are formed. These diffusion layers are formed by ion implantation and thermal diffusion of P-type or N-type ions.

A gate electrode 10 is formed on the P-type channel layer 3 through a gate oxide film 9. The gate electrode 10 is made of polysilicon and a metal silicide (WSi, CoSi, NiSi, or the like). A first interlayer film 11 that is a silicon oxide film is formed on the gate electrode 10 by a CVD method or the like. In this manner, a transistor is formed on the epitaxial layer 2.

As an electrode at a first level, a first source electrode 12a and a first drain electrode 13a made of aluminum or a compound thereof are formed on the P$^-$-type epitaxial layer 2. The first source electrode 12a is electrically connected to the N$^+$-type source layer 7 and the P$^{++}$-type source sinker layer 8. The P$^{++}$-type source sinker layer 8 electrically connects the first source electrode 12a to the P$^{++}$-type semiconductor substrate 1. The P$^{++}$-type semiconductor substrate 1 is grounded and used as a source electrode. The first drain electrode 13a is electrically connected to the N$^+$-type drain layer 6. A second interlay film 14 that is a silicon oxide film is formed on the first source electrode 12a and the first drain electrode 13a by a CVD method or the like.

As an electrode at a second level, a gate drawing electrode 15 made of aluminum or a compound thereof, a second source electrode 12b, and a second drain electrode 13b are formed. The gate drawing electrode 15 is electrically connected to the gate electrode 10. The second source electrode 12b is formed on the first source electrode 12a. The second drain electrode 13b is formed on the first drain electrode 13a. A third interlayer film 16 that is a silicon oxide film is formed on the gate drawing electrode 15, the second source electrode 12b, and the second drain electrode 13b by a CVD method or the like.

As an electrode at a third level, a third source electrode 12c and a third drain electrode 13c made of aluminum or a compound thereof are formed. The third source electrode 12c is formed on the second source electrode 12b and above the gate drawing electrode 15. The first, second, and third source electrodes 12a, 12b, and 12c are source electrodes 12 electrically connected to the source of a transistor. The gate drawing electrode 15 is formed on the first source electrode 12a and surrounded with the first, second, and third source electrodes 12a, 12b, and 12c. The second and third interlayer films 14 and 16 are formed between the gate drawing electrode 15 and the source electrodes 12. A surface protecting film 17 such as a silicon nitride film is formed on the entire surface of the device including the surfaces of the source electrodes 12 by a CVD method or the like.

Figure 2:
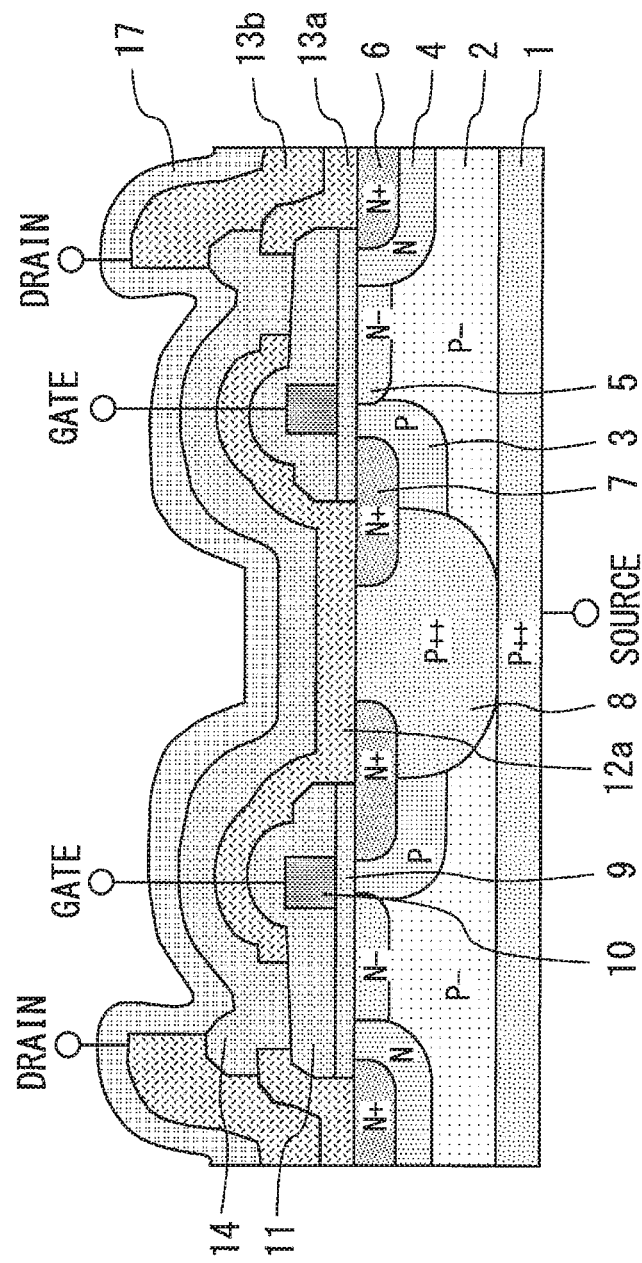
FIG. 2 is a sectional view showing a semiconductor device according to Comparative Embodiment 1.
Figure 3:
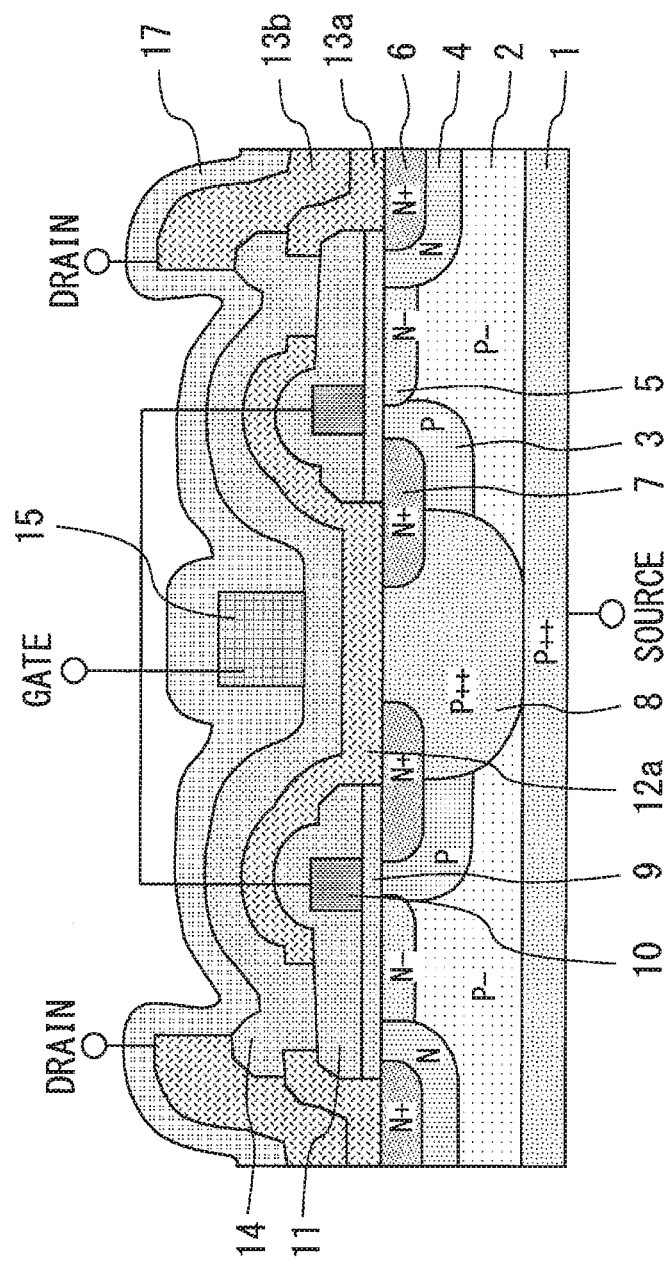
FIG. 3 is a sectional view showing a semiconductor device according to Comparative Embodiment 2.

An effect of the present embodiment will be described below in comparison with a comparative embodiment. FIG. 2 is a sectional view showing a semiconductor device according to Comparative Embodiment 1. The first source electrode 12a covers the upper sides of the gate electrode 10 and the N$^-$-type drain layer 5. FIG. 3 is a sectional view showing a semiconductor device according to Comparative Embodiment 2. The gate drawing electrode 15 electrically connected to the gate electrode 10 is formed on the first source electrode 12a as an electrode at the second level.

In Comparative Embodiment 2, since the gate drawing electrode 15 made of a material having a resistivity smaller than that of the gate electrode 10 and having a sectional area larger than that of the gate electrode 10 is used to decrease a gate resistance, a high-frequency characteristic better than that in Comparative Embodiment 1 is obtained. However, since the gate drawing electrode 15 is not electromagnetically shielded from the first and second drain electrodes 13a and 13b, a parasitic capacitance between the drain and the gate increases. Since the parasitic capacitance between the drain and the gate allows output power flowing in the first and second drain electrodes 13a and 13b to feed back to the gate drawing electrode 15, a high-frequency power gain decreases. In addition, when a plastic mold material that is a dielectric material is used in a package, the upper sides of the gate drawing electrode 15 and the first and second drain electrodes 13a and 13b are covered with the plastic mold material. For this reason, the parasitic capacitance between the drain and the gate further increases, and the high-frequency power gain further decreases.

In the present embodiment, since the gate drawing electrode 15 is surrounded by the first, second, and third source electrodes 12a, 12b, and 12c which are grounded, even though a plastic mold package is applied, output power flowing in the first, second, and third drain electrodes 13a, 13b, and 13c are not fed back to the gate drawing electrode 15, and a high-frequency power gain can be prevented from decreasing.

In Published Japanese Translation No. 2005-519474 of the PCT International Publication, the source electrode and the gate drawing electrode are formed at the first level, and the gate drawing electrode is surrounded by the electrode at the second level to shield the gate drawing electrode from the drain electrode. However, an increase in area of a source region makes a reduction in size of the device difficult. In contrast to this, in the present embodiment, since the gate drawing electrode 15 at the second level is surrounded by the second and third source electrodes 12*b* and 12*c* at the second and third levels, a horizontal dimension is reduced to make it possible to reduce the device in size.

Embodiment 2

Figure 4:
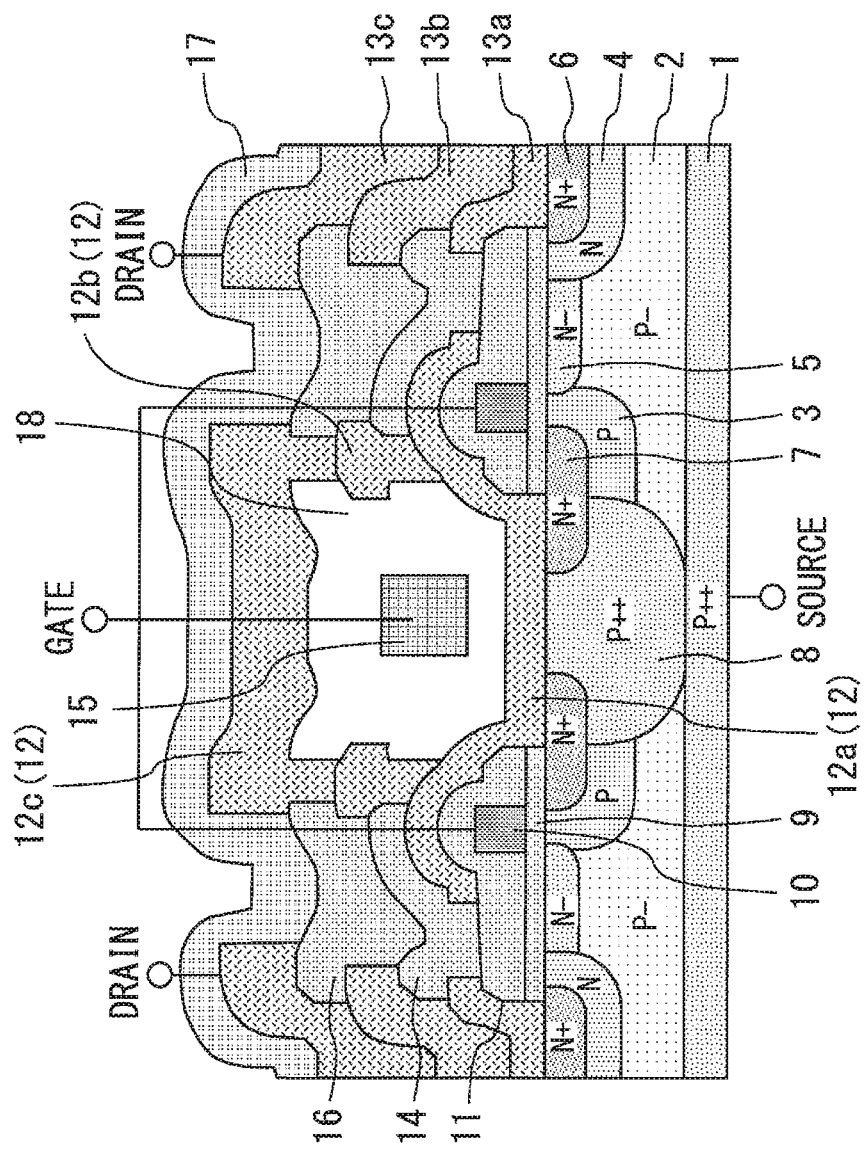
FIG. 4 is a sectional view showing a semiconductor device according to Embodiment 2 of the present invention.

FIG. 4 is a sectional view showing a semiconductor device according to Embodiment 2 of the present invention. Spaces between the gate drawing electrode 15 and the source electrodes 12 have hollow structures 18 having spaces obtained by removing the second and third interlayer films 14 and 16. The other configuration is the same as that in Embodiment 1.

In Embodiment 1, since the second and third interlayer films 14 and 16 are present between the gate drawing electrode 15 and the source electrode 12, a parasitic capacitance between the gate and the source may increase to cause deterioration of a high-frequency characteristic. In the present embodiment, the hollow structure 18 is formed between the gate drawing electrode 15 and the source electrode 12 to reduce the parasitic capacitance between the gate and the source. For this reason, the device according to the present embodiment can be made smaller than that in Embodiment 1. Even though a plastic mold package is applied, a high-frequency power gain can be prevented from decreasing.

Embodiment 3

Figure 5:
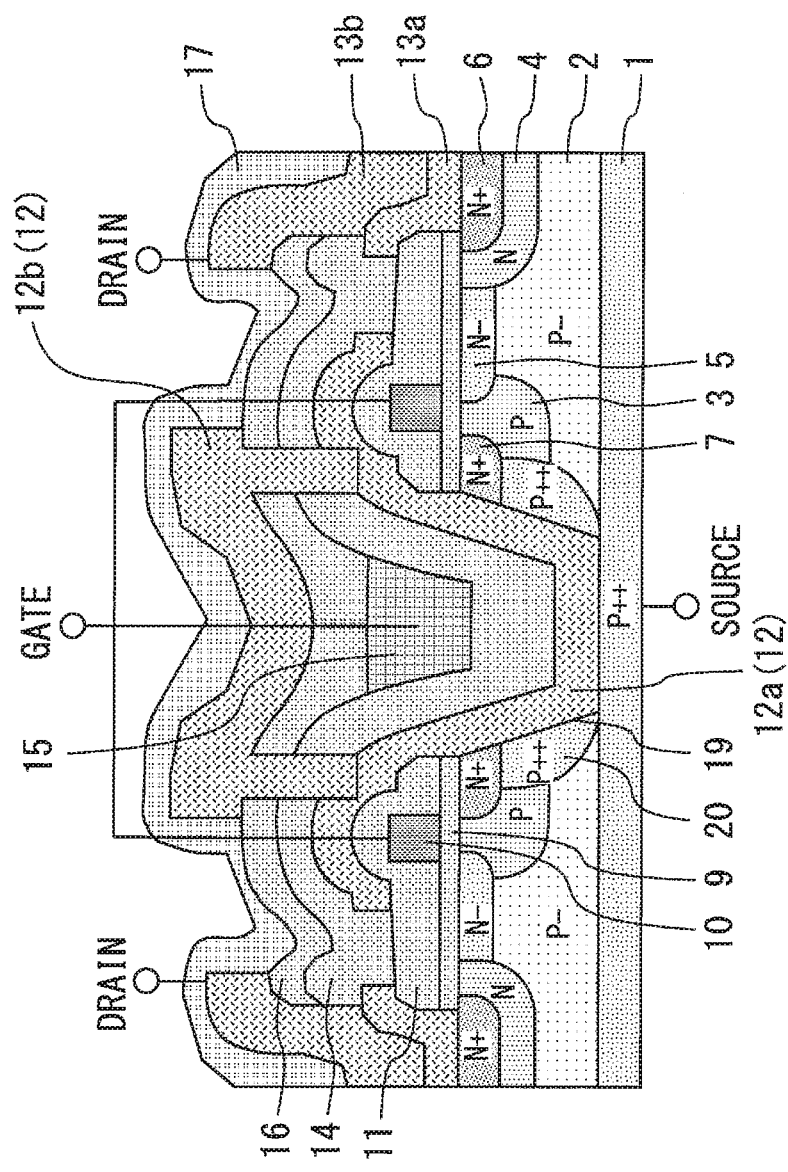
FIG. 5 is a sectional view showing a semiconductor device according to Embodiment 3 of the present invention.

FIG. 5 is a sectional view showing a semiconductor device according to Embodiment 3 of the present invention. A source trench 19 is formed by a dry etching method or the like to extend from the $P^-$-type epitaxial layer 2 to a part of the $P^{++}$-type semiconductor substrate 1. A $P^{++}$-type source layer 20 is formed on the side wall and the bottom surface of the source trench 19 by implanting a P-type impurity such as boron. The first source electrode 12*a* is formed in the source trench 19, and is electrically connected to the $P^{++}$-type semiconductor substrate 1, the $N^+$-type source layer 7, and the $P^{++}$-type source layer 20 in the source trench 19. The second interlayer film 14 that is a silicon oxide film is formed on the first source electrode 12*a* and the first drain electrode 13*a* by a CVD method or the like. The gate drawing electrode 15 is formed such that the source trench 19 is buried with a metal material (W, Al, or the like) by a CVD method, a sputtering method, or the like after the second interlayer film 14 is formed and further subjected to a photochemical process and an etching step. The third interlayer film 16 that is a silicon oxide film is formed by a CVD method or the like after the gate drawing electrode 15 is formed.

The second source electrode 12*b* that is an electrode at the second level is formed on the first source electrode 12*a* and above the gate drawing electrode 15. The gate drawing electrode 15 is formed on the first source electrode 12*a* and surrounded by the first and second source electrodes 12*a* and 12*b*.

Figure 6:
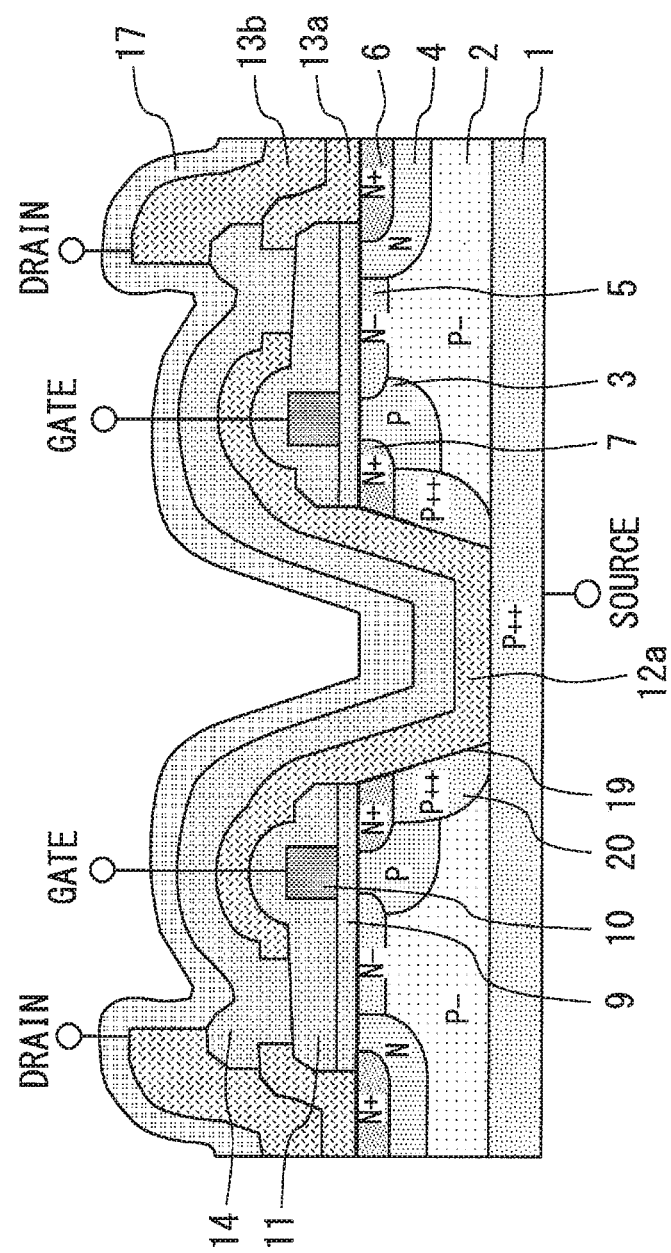
FIG. 6 is a sectional view showing a semiconductor device according to Comparative Embodiment 3.

An effect of the present embodiment will be described below in comparison with Comparative Embodiment 3. FIG. 6 is a sectional view showing a semiconductor device according to Comparative Embodiment 3. In Comparative Embodiment 3, the source trench 19 is formed in the $P^-$-type epitaxial layer 2 in the source region to directly connect the first source electrode 12*a* to the $P^{++}$-type semiconductor substrate 1. In this manner, a source ground resistance and a source inductance are reduced to achieve a high-output device. However, since the source trench 19 has a high step formed therein, a burying process using a CVD film or the like must be performed.

In the present embodiment, the application of the source trench 19 reduces the source ground resistance and the source inductance to make it possible to achieve a high-output device. Furthermore, since a gate resistance decreases in use of the gate drawing electrode 15, a high-frequency characteristic is improved. Furthermore, since the gate drawing electrode 15 is surrounded by the first and second source electrodes 12*a* and 12*b* which are grounded, even though a plastic mold package is applied, output power flowing in the first, second, and third drain electrodes 13*a*, 13*b*, and 13*c* are not fed back to the gate drawing electrode 15, and a high-frequency power gain can be prevented from decreasing.

Embodiment 4

Figure 7:
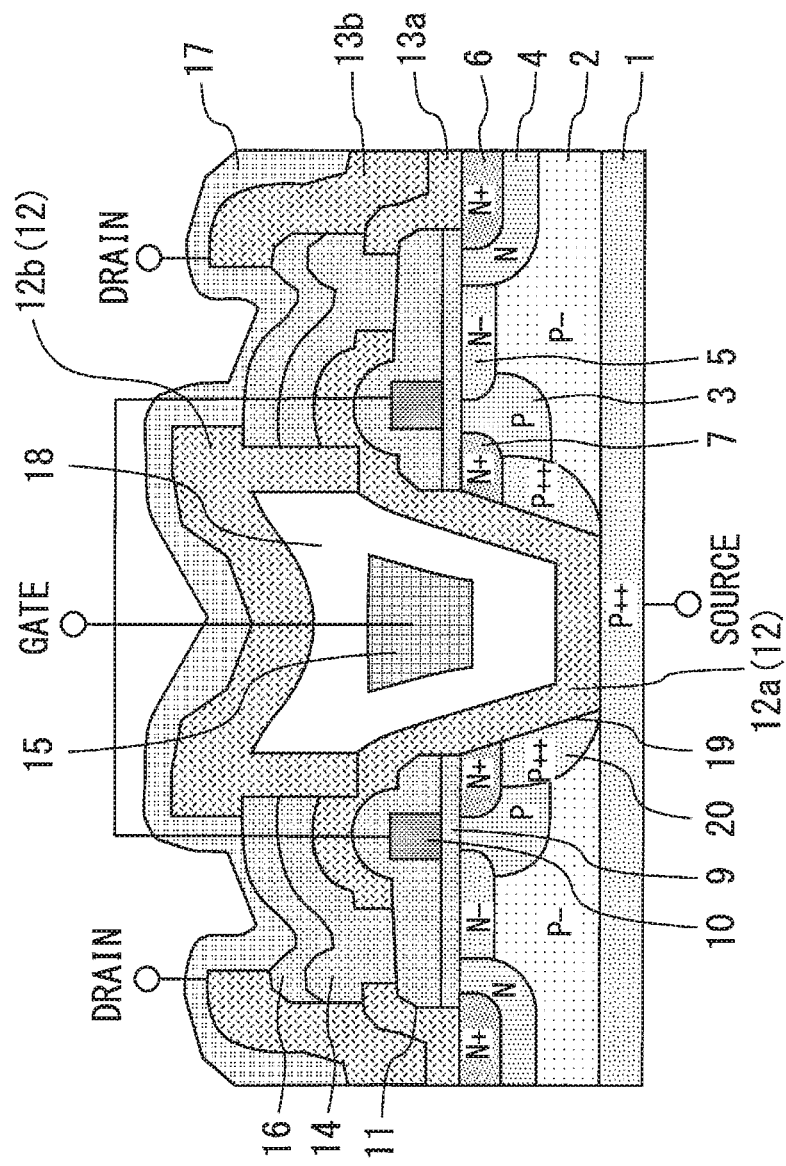
FIG. 7 is a sectional view showing a semiconductor device according to Embodiment 4 of the present invention.

FIG. 7 is a sectional view showing a semiconductor device according to Embodiment 4 of the present invention. Spaces between the gate drawing electrode 15 and the source electrodes 12 have the hollow structures 18 having spaces obtained by removing the second and third interlayer films 14 and 16. The other configuration is the same as that in Embodiment 3. A device according to the present embodiment can be made smaller than the device according to Embodiment 3. Even though a plastic mold package is applied, a high-frequency power gain can be prevented from decreasing.

Figure 8:
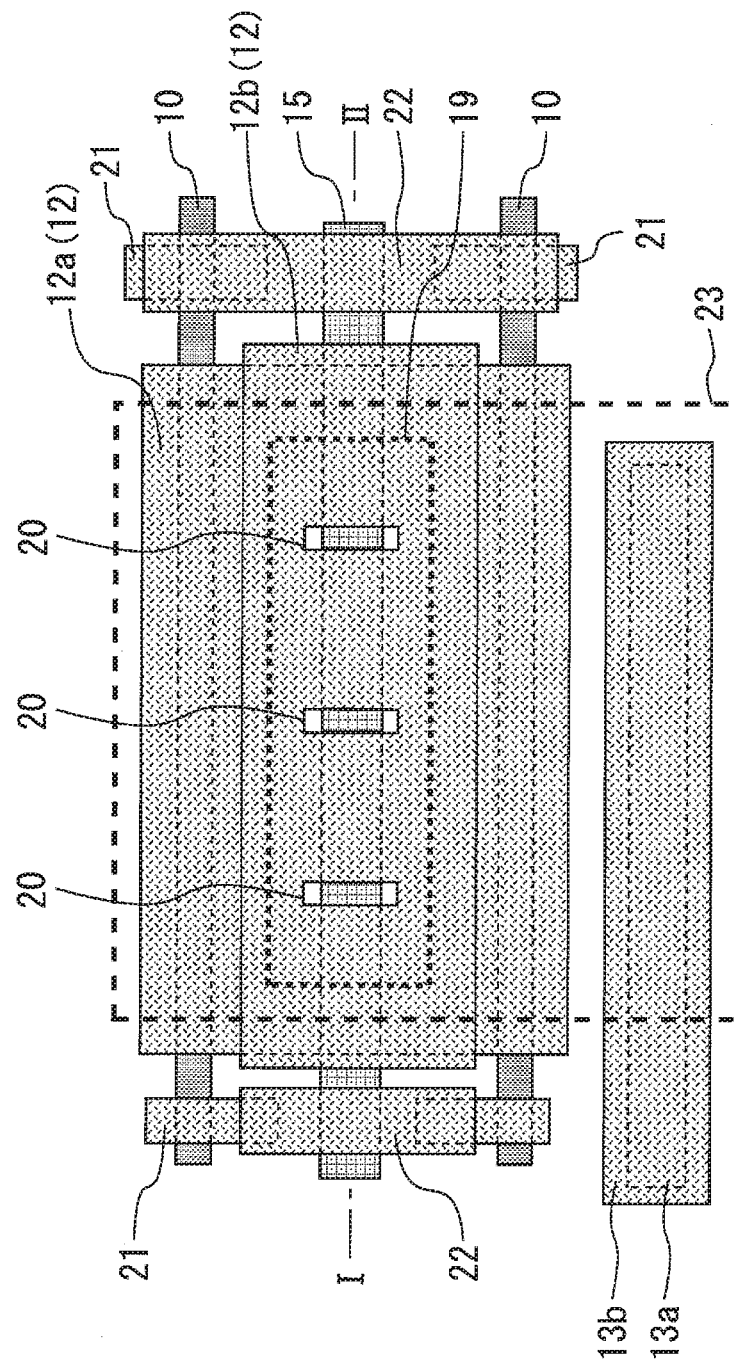
FIG. 8 is a plan view for explaining a method of manufacturing a semiconductor device according to Embodiment 4 of the present invention.
Figure 9:
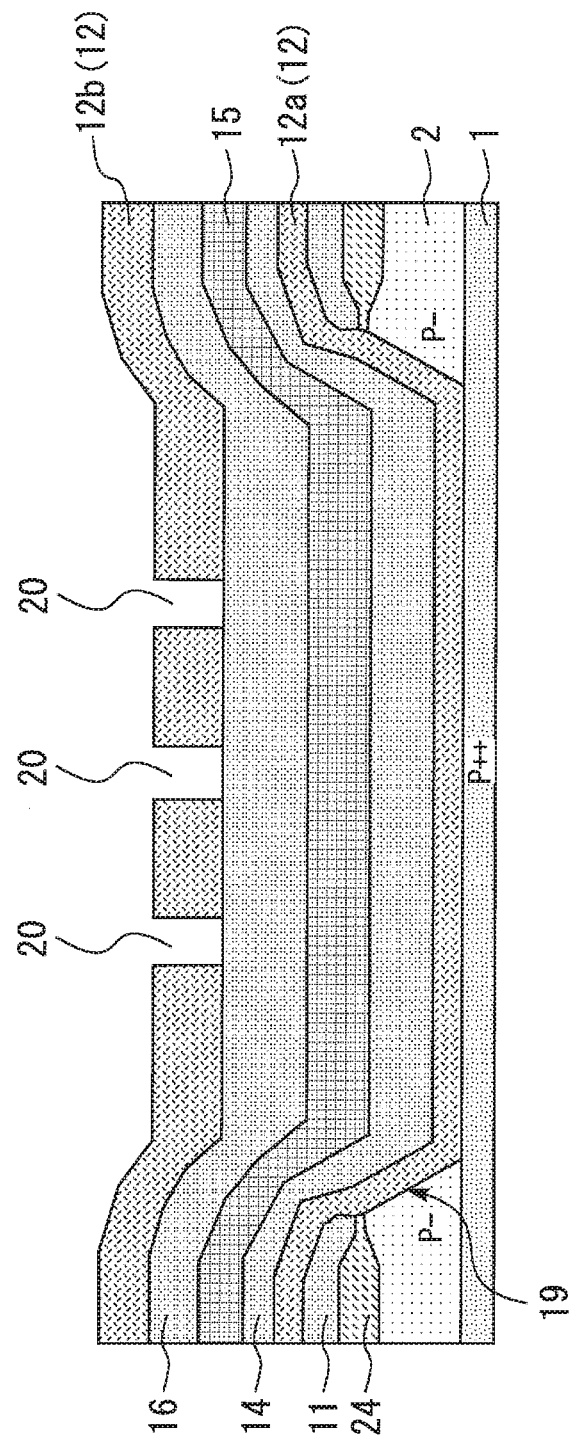
FIGS. 9 to 11 are sectional views for explaining the method of manufacturing a semiconductor device according to Embodiment 4 of the present invention.
Figure 10:
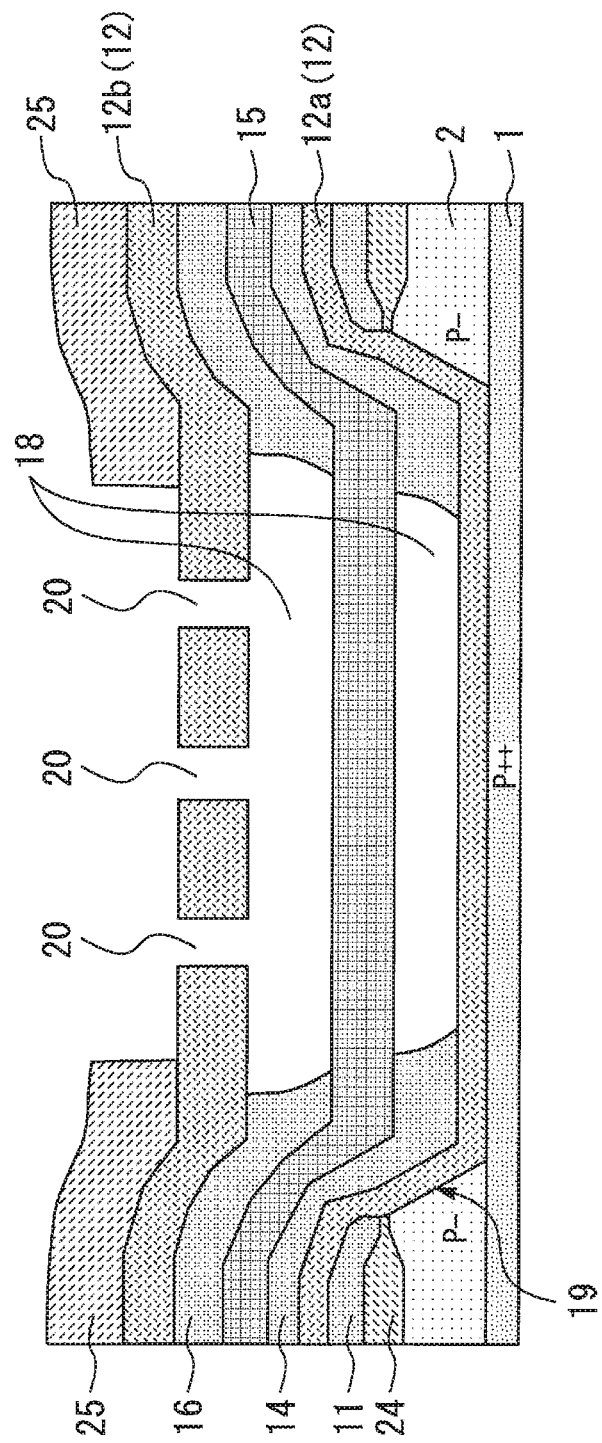
Figure 11:
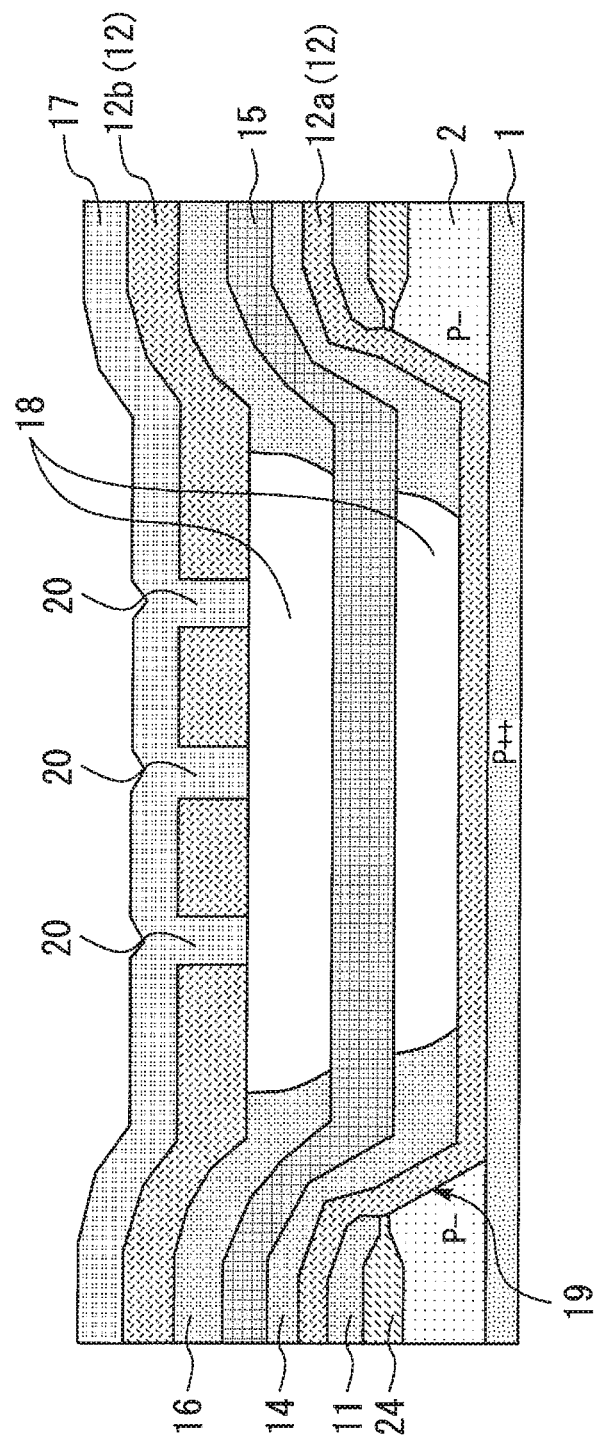

A method of manufacturing a semiconductor device according to the present embodiment will be described below. FIG. 8 is a plan view for explaining a method of manufacturing a semiconductor device according to Embodiment 4 of the present invention. FIGS. 9 to 11 are sectional views for explaining the method of manufacturing a semiconductor device according to Embodiment 4 of the present invention. FIGS. 9 to 11 correspond to sectional along a line I-II in FIG. 8.

The $P^-$-type epitaxial layer 2 is formed on the $P^{++}$-type semiconductor substrate 1. A transistor having the P-type channel layer 3 and the like is formed on the $P^-$-type epitaxial layer 2. The gate drawing electrode 15 electrically connected to the gate of the transistor is formed on the epitaxial layer 2. The second and third interlayer films 14 and 16 that are first sacrificial films covering the periphery of the gate drawing electrode 15 are formed. The first and second source electrodes 12*a* and 12*b* electrically connected to the source of the transistor are formed to cover the periphery of the resultant structure.

As shown in FIGS. 8 and 9, a slit hole 20 is formed in the second source electrode 12*b* that is the uppermost layer of the source electrode above the source trench 19. The gate drawing electrode 15 is electrically connected to the gate electrodes 10 on both the sides by gate wires 21 and 22. In FIG. 8, an active region 23 of the transistor is indicated by a broken line. As shown in FIG. 9, a field oxide film 24 is formed in an inactive region of the transistor.

As shown in FIG. 10, a photoresist 25 having an opening formed only around the slit hole 20 is formed. The second and third interlayer films 14 and 16 are selectively etched for the gate drawing electrode 15 and the source electrodes 12 through the slit hole 20 by using hydrofluoric acid or mixed acid containing hydrofluoric acid to form the hollow structures 18 between the gate drawing electrode 15 and the source electrodes 12.

As shown in FIG. 11, the photoresist 25 is removed, and the surface protecting film 17 such as a glass coat film is formed on the source electrode 12. In this case, if the short side of the slit hole 20 is set to have a dimension which is equal to or smaller than twice of the thickness of the surface protecting film 17, the slit hole 20 can be sealed with the surface protecting film 17. However, a first slit hole having a short-side dimension which is equal to or smaller than twice of the thickness of the surface protecting film 17 and a second slit hole having a short-side dimension which is larger than the twice of the thickness of the surface protecting film 17 may be formed to seal the first slit hole with the surface protecting film 17 without sealing the second slit hole. In this manner, the hollow structures 18 are incompletely sealed to make it possible to prevent the hollow structures 18 from being broken by thermal expansion of air in the hollow structures 18.

The above steps allow the semiconductor device according to the present embodiment having the hollow structures 18 to be manufactured. The hollow structures 18 between the gate drawing electrode 15 and the source electrodes 12 according to Embodiment 2 are also formed by the same method as described above.

In Embodiment 3, since the second and third interlayer films 14 and 16 are present between the gate drawing electrode 15 and the source electrodes 12, a parasitic capacitance between the gate and the source may increase to deteriorate a high-frequency characteristic. In the present embodiment, the hollow structures 18 are formed between the gate drawing electrode 15 and the source electrodes 12 to reduce the parasitic capacitance between the gate and the source. For this reason, the device can be made smaller than that in Embodiment 3. Even though a plastic mold package is applied, a high-frequency power gain can be prevented from decreasing.

Embodiment 5

Figure 12:
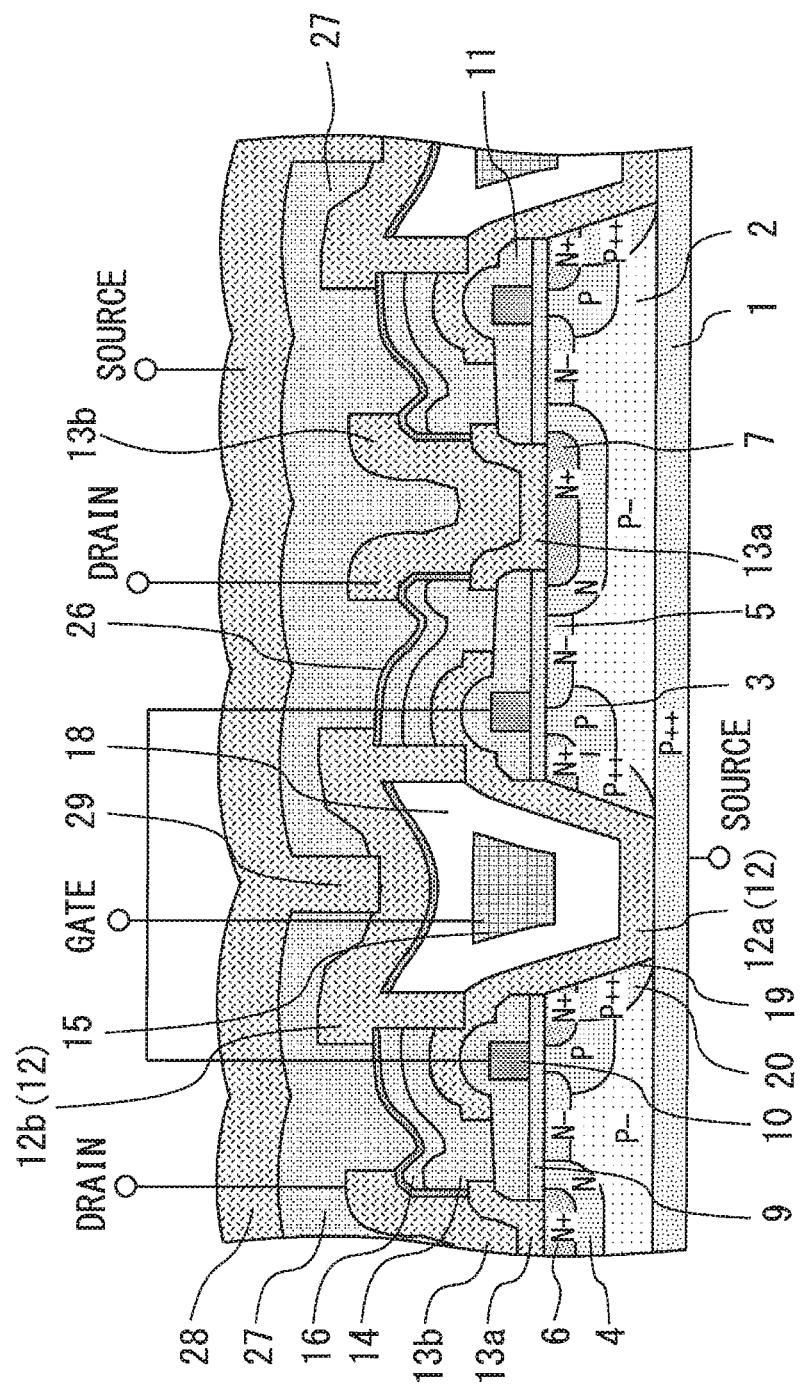
FIGS. 12 and 13 are sectional views for explaining a method of manufacturing a semiconductor device according to Embodiment 5 of the present invention.
Figure 13:
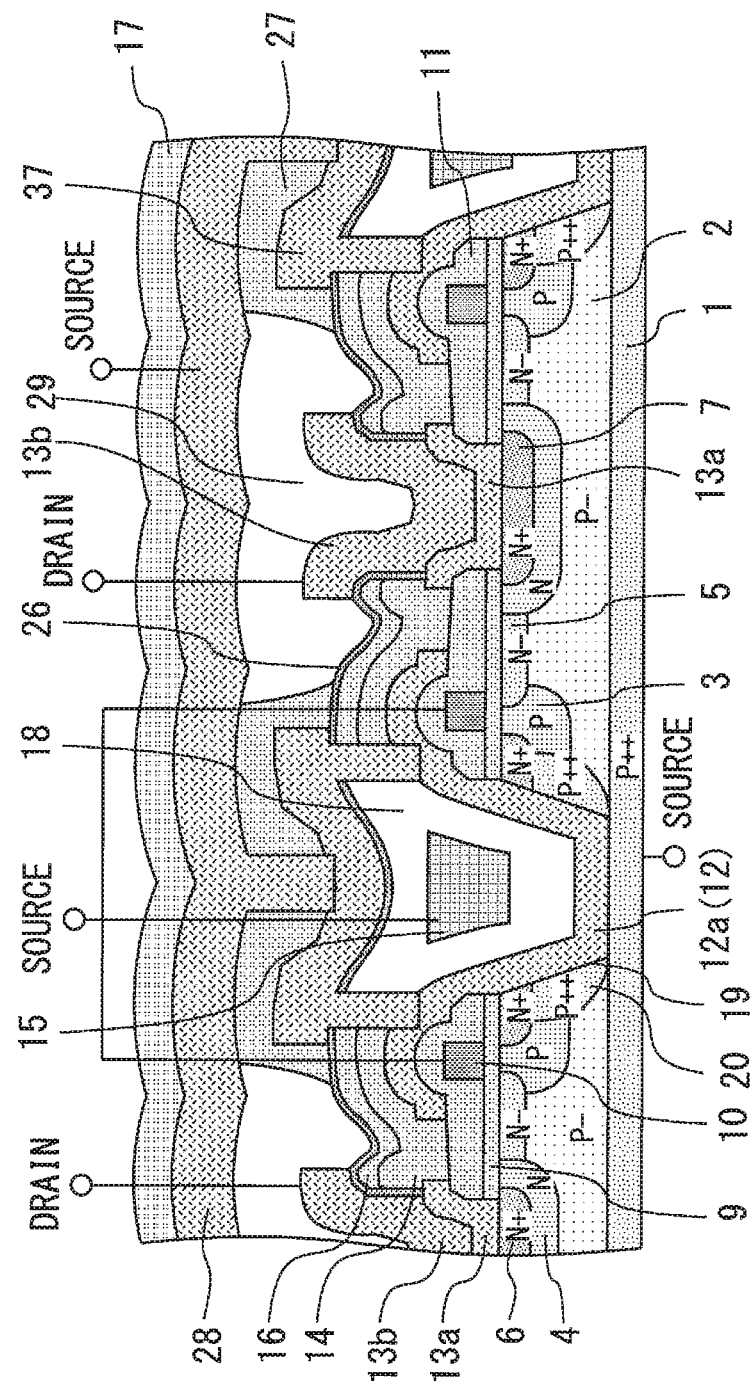

FIGS. 12 and 13 are sectional views for explaining a method of manufacturing a semiconductor device according to Embodiment 5 of the present invention. First, the same manufacturing steps as those in Embodiment 4 are performed.

Next, as shown in FIG. 12, a stopper layer 26 is formed on the third interlayer film 16 that is a silicon oxide film by a CVD method or the like. The stopper layer 26 is a silicon nitride film or another insulating film which is not etched by hydrofluoric acid or mixed acid containing hydrofluoric acid. A silicon oxide film 27 covering the periphery of the second drain electrode 13b is formed on the stopper layer 26 by a CVD method or the like. A source pad 28 is formed on the silicon oxide film 27. The source pad 28 is electrically connected to the source electrode 12 through a source contact hole 29. The source pad 28 is formed to cover the upper side of the active part of the transistor including second drain electrode 13b. The surface protecting film 17 is formed on the source pad 28.

As shown in FIG. 13, the silicon oxide film 27 is selectively etched for the stopper layer 26 and the second drain electrode 13b to form independent hollow structures 29 electromagnetically shielded from the hollow structures 18 around the gate drawing electrode 15. A slit hole (not shown) is formed in the source pad 28 above the second drain electrode 13b. In use of the slit hole, the hollow structures 29 according to the present embodiment are formed like the hollow structures 18 according to Embodiment 4.

In the present embodiment, in addition to the configuration and the effect of Embodiment 4, the source pad 28 is used to make it possible to achieve grounding of the transistor on the upper surface of the device. In addition, heat generated in the operation of the transistor can be easily dissipated from the upper surface of the device. Thus, the device can be reduced in size, and a ground inductance decreases to make it possible to achieve a high-frequency output. Furthermore, source, gate, and drain terminals can also be formed on the upper surface of the device, and flip-chip mounting and application of a chip size package (CSP) can be achieved. The hollow structure 29 is formed between the second drain electrode 13b and the source pad 28 to reduce the parasitic capacitance between the drain and the source. For this reason, the device can be made smaller that in Embodiment 4, and, even though a plastic mold package is applied, a high-frequency power gain can be prevented from decreasing.

Embodiment 6

Figure 14:
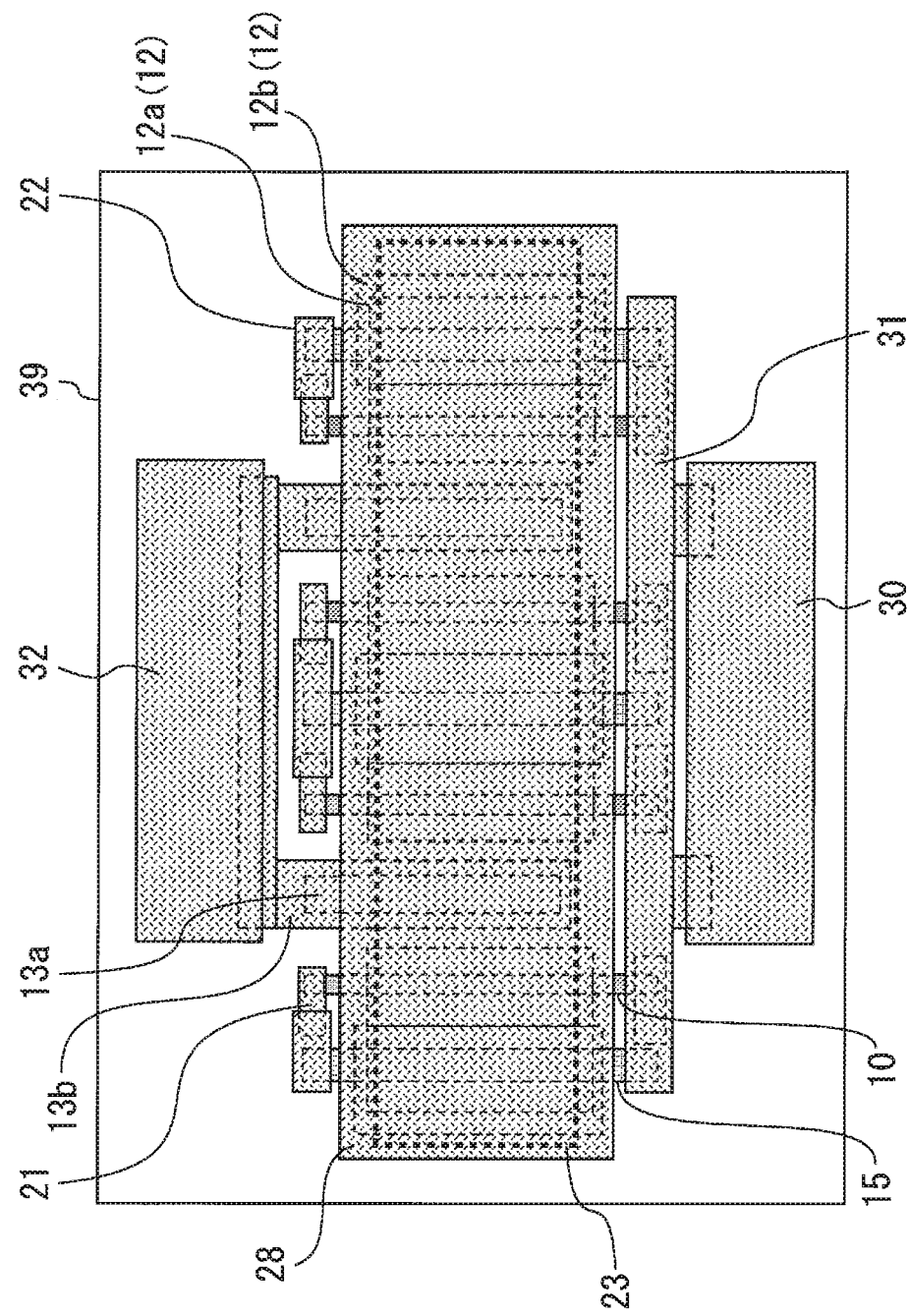
FIGS. 14 and 15 are plan views showing a semiconductor device according to Embodiment 6 of the present invention.
Figure 15:
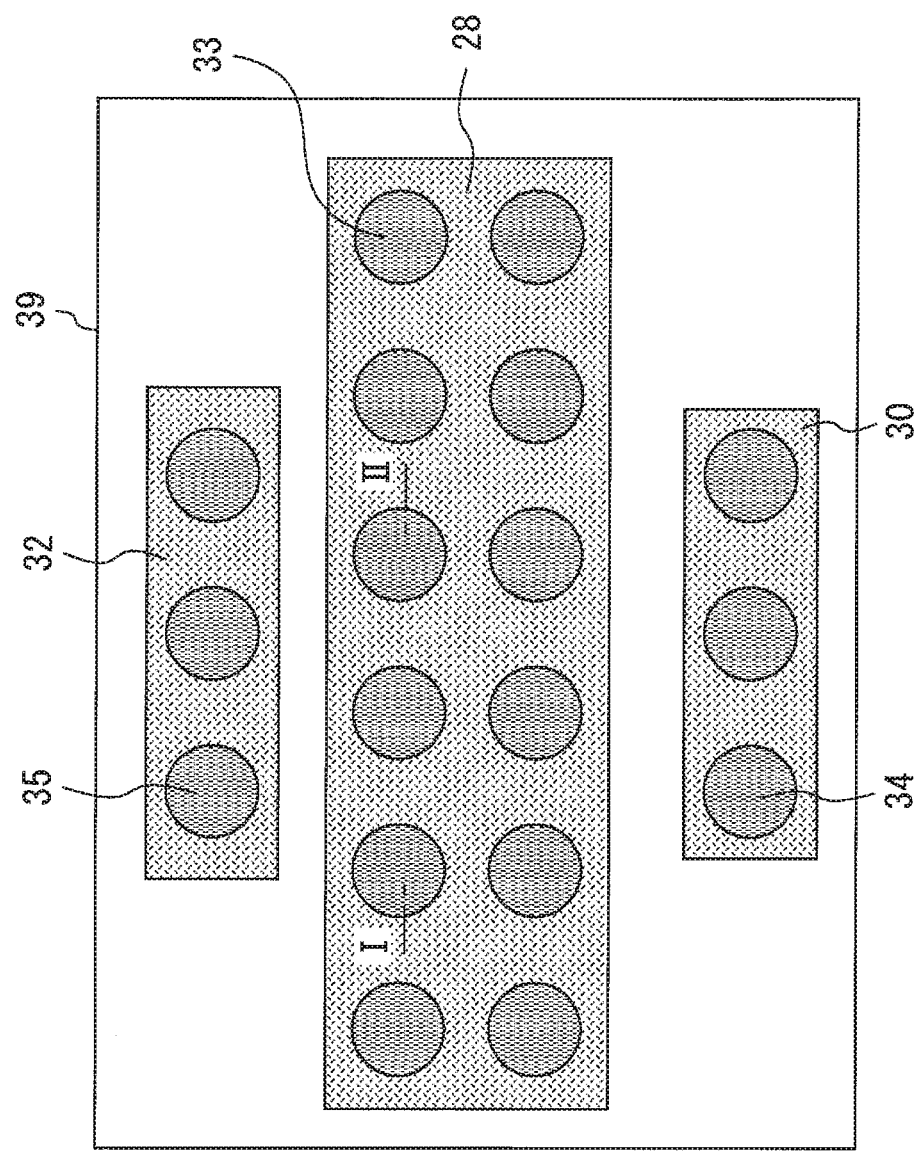

FIGS. 14 and 15 are plan views showing a semiconductor device according to Embodiment 6 of the present invention. This embodiment is obtained by applying Embodiment 5 to a product which can be flip-chip-mounted.

FIG. 14 shows a state obtained before a bump electrode is formed. A gate pad 30 is electrically connected to the gate drawing electrode 15 by a gate wire 31. The drain pad 32 is electrically connected to the second drain electrode 13b.

FIG. 15 shows a state obtained after the bump electrode is formed. A source bump electrode 33, a gate bump electrode 34, and a drain bump electrode 35 are formed on the source pad 28, the gate pad 30, and the drain pad 32, respectively. The source bump electrode 33, the gate bump electrode 34, and the drain bump electrode 35 are made of a metal material such as copper, gold, or a solder material and formed by a plating method or the like.

Figure 16:
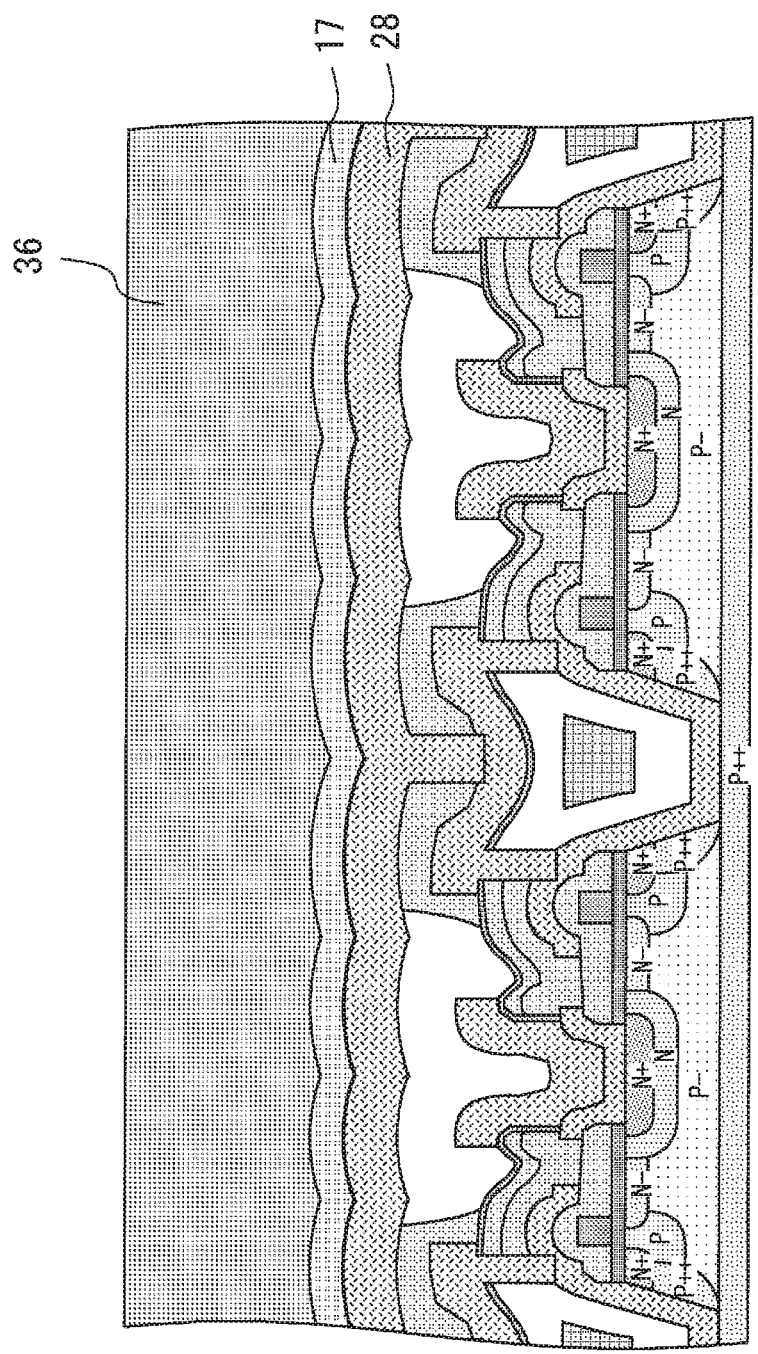
FIGS. 16 and 17 are sectional views for explaining the method of manufacturing a semiconductor device according to Embodiment 6 of the present invention.
Figure 17:
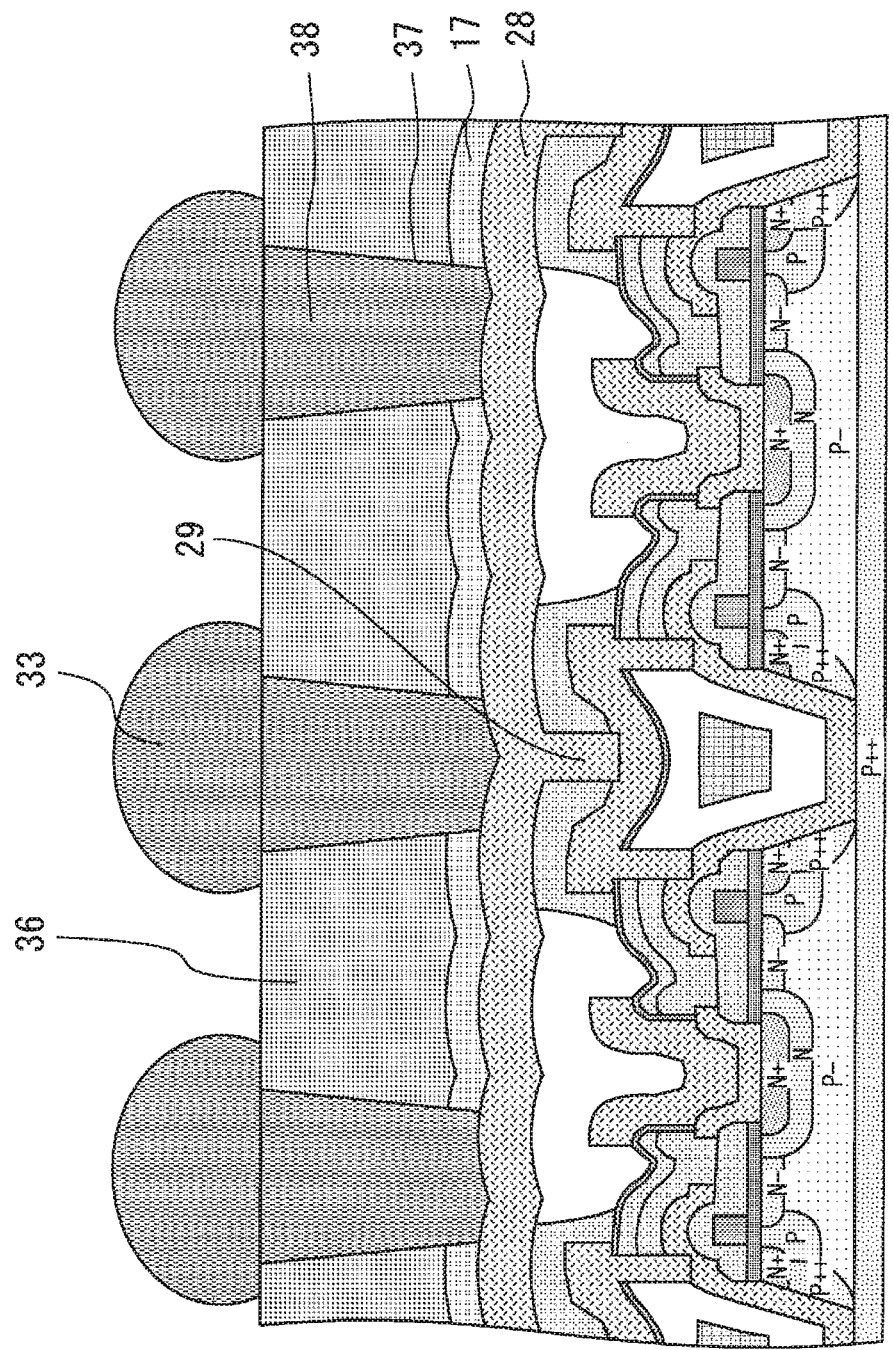

A method of manufacturing a semiconductor device according to the present embodiment will be described below. FIGS. 16 and 17 are sectional views for explaining the method of manufacturing a semiconductor device according to Embodiment 6 of the present invention. FIGS. 16 and 17 correspond to sections along a I-II line in FIG. 15.

First, the same manufacturing steps as those in Embodiment 5 are performed. Next, as shown in FIG. 16, on the entire area of the chip on the source pad 28 and the surface protecting film 17, a resin film 36 such as polyimide or plastic is formed by a coating method or the like.

As shown in FIG. 17, openings are formed in the surface protecting film 17 and the resin film 36 by a dry etching method or the like to form a contact hole 37. A metal material such as copper or tungsten is buried in the contract hole 37 by a plating method, a CVD method, or the like to form a plug wire 38. The source bump electrode 33 made of copper, gold, a solder material, or the like is formed on the plug wire 38. The source bump electrode 33 is formed right above the source contact hole 29. Although not shown, in this step, the gate bump electrode 34 and the drain bump electrode 35 are formed on the gate pad 30 and the drain pad 32, respectively.

In the present embodiment, on the upper surface of the device, the source bump electrode 33, the gate bump electrode 34, and the drain bump electrode 35 are formed on the source pad 28, the gate pad 30, the drain pad 32, respectively. In this manner, the inductance components of the gate, the source, and the drain decrease to make it possible to increase a high-frequency gain. Application of a chip-size package (CSP) product having a size equal to that of an outer circumference 39 of the transistor chip can be achieved, and the product can be considerably reduced in size in comparison with a conventional product.

When the resin film 36 that is a dielectric material is formed on the upper surface of the device, increases in parasitic capacitance between the gate electrode, the drain electrode, and the source electrode deteriorate a high-frequency characteristic. For this reason, Japanese Unexamined Patent Publication No. 2004-6816 proposes that the gate electrode, the drain electrode, and the source electrode are electromagnetically shielded by a shield metal and the spaces between a shield metal and the electrodes are made to be hollow so as to reduce the capacitances between the electrodes. In Embodiments 5 and 6, the independent hollow structure 29 electromagnetically shielded from the hollow structure 18 around the gate drawing electrode 15 is formed between the second drain electrode 13b and the source pad 28. For this reason, the parasitic capacitance between the gate and the drain is lower than that in Japanese Unexamined Patent Publication No. 2004-6816. Thus, even though the resin film 36 that is a dielectric material is formed on the upper part of the transistor, the parasitic capacitances between the gate and the drain, between the gate and the source, and between the drain and the source can be reduced, thus the high-frequency characteristic can be prevented from being deteriorated.

Since the source bump electrode 33 is formed right above the source contact hole 29, heat generated from an active region of the transistor can be dissipated. For this reason, the semiconductor device can be advantageously prevented from being broken, and the long life of the semiconductor device can be achieved. In this embodiment, although the structure in Embodiment 5 is used, even though a bump electrode is formed on the upper surface of the structure in Embodiment 2, the same effect as described above can be exerted.

Although Embodiments 1, 2, 5, and 6 describe the electrode structures each having three levels, more than three levels may be present. More specifically, the second source electrode 12b and the gate drawing electrode 15 are not limited to electrodes at the second level, and electrodes at more than second level may be used. The third source electrode 12c is not limited to an electrode at the third level, and an electrode at more than third level may be used. Although Embodiments 3 and 4 describe two-level electrode structures, the structures may have more than two levels. More specifically, the second source electrode 12b is not limited to an electrode at the second level, and an electrode at more than second level may be used. In any case, the gate drawing electrode 15 need only be formed between an electrode at an uppermost level and an electrode at a lowermost level.

Embodiments 1 to 6 describe N-channel type high-frequency high-output horizontal field effect transistors using silicon substrates. However, the present invention can also be applied to a P-channel type high-frequency high-output horizontal field effect transistor to exert the same effect as described above. The present invention can also be applied to a horizontal field effect transistor using SiC, GaN, GaAs, and other compounds as semiconductor materials of a semiconductor substrate and an epitaxial layer to exert the same effect as described above.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-019685, filed on Feb. 4, 2016 including specification, claims, drawings and summary, on which the Convention priority of the present application is based, is incorporated herein by reference in its entirety.

The invention claimed is:

1. A semiconductor device having electrodes of three or more levels, comprising:
    a semiconductor substrate;
    an epitaxial layer formed on the semiconductor substrate;
    a transistor formed on the epitaxial layer;
    a source electrode formed on the epitaxial layer and electrically connected to a source of the transistor; and
    a gate drawing electrode formed on the epitaxial layer and electrically connected to a gate of the transistor,
    wherein the source electrode includes a first source electrode, a second source electrode which is an electrode at a second or higher level on the first source electrode, and a third source electrode which is an electrode at a third or higher level on the second source electrode and above the gate drawing electrode, and
    the gate drawing electrode is an electrode at a second or higher level on the first source electrode and surrounded with the first, second, and third source electrodes.

2. The semiconductor device according to claim 1, further comprising an insulating film formed between the gate drawing electrode and the source electrode.

3. The semiconductor device according to claim 1, wherein a first hollow structure is formed between the gate drawing electrode and the source electrode.

4. The semiconductor device according to claim 3, further comprising:
    a drain electrode formed on the epitaxial layer and electrically connected to a drain of the transistor; and
    a source pad formed above the drain electrode and electrically connected to the source electrode,
    wherein a second hollow structure electromagnetically shielded from the first hollow structure around the gate drawing electrode is formed between the drain electrode and the source pad.

5. The semiconductor device according to claim 4, wherein the source pad is formed to cover an upper side of an active part of the transistor.

6. The semiconductor device according to claim 4, further comprising:
    a source contact hole electrically connecting the source electrode to the source pad;
    a gate pad electrically connected to the gate drawing electrode;
    a drain pad electrically connected to the drain electrode; and
    a source bump electrode, a gate bump electrode, and a drain bump electrode formed on the source pad, the gate pad, and the drain pad, respectively,
    wherein the source bump electrode is formed right above the source contact hole.

7. The semiconductor device according to claim 1, wherein
    at least a portion of the gate drawing electrode is completely surrounded with the first, second, and third source electrodes.

8. The semiconductor device according to claim 1, comprising:
a drain electrode formed on the epitaxial layer and connected to a drain of the transistor, wherein the gate drawing electrode is electromagnetically shielded from the drain electrode.

9. The semiconductor device according to claim 1, wherein
the first source electrode is on the epitaxial layer side of the gate drawing electrode, the second source electrode is on each of opposing lateral sides of the gate drawing electrode, and the third source electrode is on a side of the gate drawing electrode opposite to the epitaxial layer.

10. A semiconductor device having electrodes of two or more levels, comprising:
a semiconductor substrate;
an epitaxial layer formed on the semiconductor substrate and in which a source trench is formed;
a transistor formed on the epitaxial layer;
a source electrode formed on the epitaxial layer and electrically connected to a source of the transistor; and
a gate drawing electrode formed on the epitaxial layer and electrically connected to a gate of the transistor,
wherein the source electrode includes a first source electrode formed in the source trench, and a second source electrode which is an electrode at a second or higher level on the first source electrode and above the gate drawing electrode, and
the gate drawing electrode is formed on the first source electrode and surrounded with the first and second source electrodes.

11. The semiconductor device according to claim 10, further comprising an insulating film formed between the gate drawing electrode and the source electrode.

12. The semiconductor device according to claim 10, wherein a first hollow structure is formed between the gate drawing electrode and the source electrode.

13. The semiconductor device according to claim 12, further comprising:
a drain electrode formed on the epitaxial layer and electrically connected to a drain of the transistor; and
a source pad formed above the drain electrode and electrically connected to the source electrode,
wherein a second hollow structure electromagnetically shielded from the first hollow structure around the gate drawing electrode is formed between the drain electrode and the source pad.

14. The semiconductor device according to claim 13, wherein the source pad is formed to cover an upper side of an active part of the transistor.

15. The semiconductor device according to claim 12, further comprising:
a source contact hole electrically connecting the source electrode to the source pad;
a gate pad electrically connected to the gate drawing electrode;
a drain pad electrically connected to the drain electrode; and
a source bump electrode, a gate bump electrode, and a drain bump electrode formed on the source pad, the gate pad, and the drain pad, respectively,
wherein the source bump electrode is formed right above the source contact hole.

16. A method of manufacturing a semiconductor device comprising:
forming an epitaxial layer on a semiconductor substrate;
forming a transistor on the epitaxial layer;
forming a gate drawing electrode electrically connected to a gate of the transistor on the epitaxial layer;
forming a first sacrificial film covering a periphery of the gate drawing electrode;
forming a source electrode electrically connected to a source of the transistor to cover a periphery of the first sacrificial film;
forming a slit hole in an uppermost layer of the source electrode; and
etching the first sacrificial film selectively for the gate drawing electrode and the source electrode through the slit hole to form a first hollow structure between the gate drawing electrode and the source electrode.

17. The method according to claim 16, wherein the step of forming the source electrode includes:
forming a first source electrode;
forming a second source electrode which is an electrode at a second or higher level on the first source electrode; and
forming a third source electrode which is an electrode at a third or higher level on the second source electrode and above the gate drawing electrode, and
the gate drawing electrode is an electrode at a second or higher level formed on the first source electrode and surrounded with the first, second and third source electrodes.

18. The method according to claim 16, further comprising forming a source trench in the epitaxial layer,
wherein the step of forming the source electrode includes:
forming a first source electrode in the source trench; and
forming a second source electrode which is an electrode at a second or higher level on the first source electrode and above the gate drawing electrode, and
the gate drawing electrode is formed on the first source electrode and surrounded with the first and second source electrodes.

19. The method according to claim 16, further comprising forming a surface protecting film on the source electrode to seal the slit hole,
wherein a short-side dimension of a slit hole is equal to or smaller than twice of a thickness of the surface protecting film.

20. The method according to claim 16, further comprising:
forming first and second slit holes as the slit hole; and
forming a surface protecting film to seal the first slit hole and not to seal the second slit hole,
wherein a short-side dimension of a first slit hole is equal to or smaller than twice of a thickness of the surface protecting film, and
a short-side dimension of a second slit hole is larger than twice of the thickness of the surface protecting film.

21. The method according to claim 16, further comprising:
forming an insulating film on the epitaxial layer;
forming a stopper layer on the insulating film;
forming a drain electrode electrically connected to a drain of the transistor on the epitaxial layer and;
forming a second sacrificial film covering a periphery of the drain electrode on the stopper layer;
forming a source pad electrically connected to the source electrode on the second sacrificial film; and etching the second sacrificial film selectively for the stopper layer and the drain electrode to form a second hollow structure electromagnetically shielded from the first hollow structure around the gate drawing electrode between the drain electrode and the source pad.

* * * * *